US006795331B2

(12) United States Patent
Noro

(10) Patent No.: US 6,795,331 B2
(45) Date of Patent: Sep. 21, 2004

(54) FERROELECTRIC MEMORY WHEREIN BIT LINE CAPACITANCE CAN BE MAXIMIZED

(75) Inventor: Kouichi Noro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 85 days.

(21) Appl. No.: 10/334,060

(22) Filed: Dec. 31, 2002

(65) Prior Publication Data

US 2003/0169616 A1 Sep. 11, 2003

(30) Foreign Application Priority Data

Mar. 8, 2002 (JP) ......................................... 2002-062981

(51) Int. Cl.$^7$ .............................................. G11C 11/12
(52) U.S. Cl. ........................................ 365/145; 365/149
(58) Field of Search ................................ 365/145, 149, 365/63, 200

(56) References Cited

U.S. PATENT DOCUMENTS 5,430,671 A    7/1995  Hirano et al. ............... 365/145
6,178,107 B1 *  1/2001  Kang ........................ 365/145
6,229,730 B1 *  5/2001  Kato ......................... 365/145
6,327,172 B1 * 12/2001  Ishiwara ..................... 365/145
6,385,076 B1 *  5/2002  Fujimori .................... 365/145
6,731,529 B2 *  5/2004  Jacob et al. ................. 365/145

FOREIGN PATENT DOCUMENTS

JP         07-013019         1/1995

* cited by examiner

Primary Examiner—Tan T. Nguyen
(74) Attorney, Agent, or Firm—Arent Fox PLLC

(57) ABSTRACT

In a ferroelectric memory, there are provided a plurality of word lines, a plurality of bit lines crossing there-with, a plurality of memory cells having ferroelectric capacitors arranged at the positions of these crossovers and a plurality of correction capacitors connectable with the bit lines. At least some of the plurality of correction capacitors are connected with a bit line so as to be capable of increasing bit line capacitance by a prescribed amount.

13 Claims, 12 Drawing Sheets

Cell Array Structure

FIG. 4
Polarization Direction
Voltage is applied to capacitor
No voltage is applied to capacitor
(K)
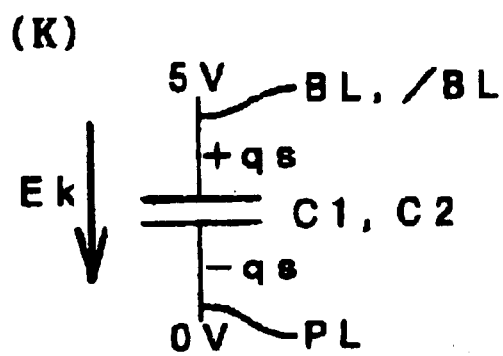
(L)
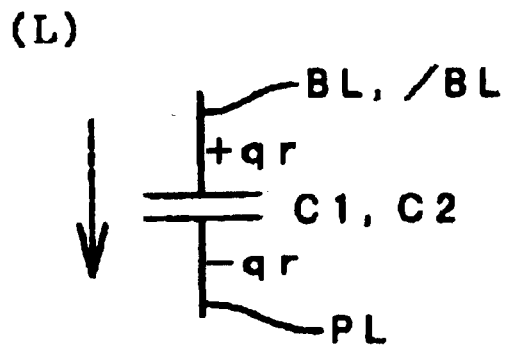
(M)
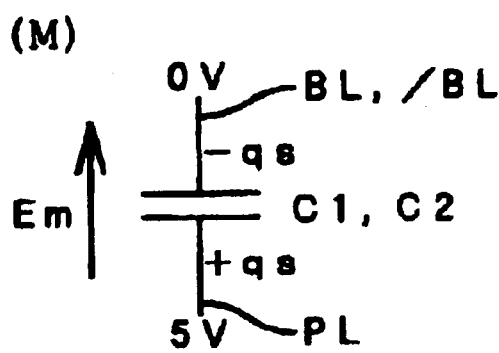
(N)
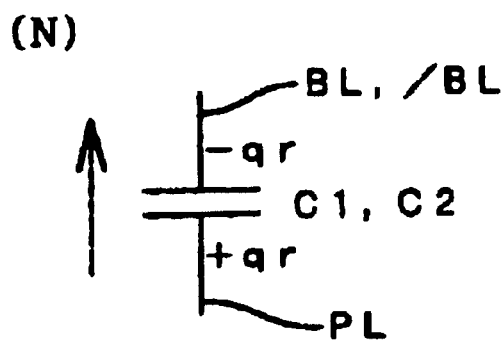

Cell Array Structure

Cell Array Structure

1

FERROELECTRIC MEMORY WHEREIN BIT LINE CAPACITANCE CAN BE MAXIMIZED

BACKGROUND OF THE INVENTION

1. Field of the Invention

The present invention relates to a ferroelectric memory utilizing ferroelectric capacitors and in particular relates to a ferroelectric memory wherein bit line capacitance can be optimized.

2. Description of the Related Art

Ferroelectric memories utilizing ferroelectric capacitors are widely employed in IC cards etc since they are non-volatile and are capable of high-speed writing and reading comparable with DRAMs. In such a ferroelectric memory device, data is stored and read by utilizing the hysteresis characteristic and residual polarization effect possessed by the ferroelectric films of ferroelectric capacitors. When writing, a ferroelectric capacitor is put in a polarized condition in one direction by applying an electrical field in one direction to the ferroelectric capacitor, or is put in a polarized condition in the opposite direction by applying an electrical field to the ferroelectric capacitor in the opposite direction. Such a polarized condition is maintained as residual polarization even after the electrical field that was applied to the ferroelectric capacitor is removed and so functions as non-volatile memory. On the other hand, when reading, the voltage of a bit line pair is changed by flowing out different amounts of charge from the capacitor to the bit line pair in accordance with the polarization condition of the ferroelectric capacitor and the minute voltage difference output to the bit line pair is detected by a sensing amplifier.

FIG. 1 is a circuit diagram of a typical prior art ferroelectric memory cell. The memory cell MC illustrated in the Figure is of so-called two-transistor, two-capacitor (2T2C) construction and comprises a pair of transistors Q1, Q2 and a pair of ferroelectric capacitors C1, C2 connected with these. The gates of transistors Q1, Q2 are connected with word line WL and, in addition, the source or drain electrodes of transistors Q1, Q2 are respectively connected with a pair of bit lines BL, /BL. In addition, ferroelectric capacitors C1, C2 are connected with plate line PL. Also, sensing amplifier SA is connected with bit line pair BL, /BL. Sensing amplifier SA comprises a pair of cross-connected CMOS inverters 10, 12 and activating transistors 13, 14 provided between these and power sources Vcc and Vss. When activating signals PSA, NSA are applied to activating transistors 13, 14, the sensing amplifier comprising the pair of CMOS inverters 10, 12 is activated so as to detect the voltage difference between bit line pair BL, /BL.

In writing, the pair of capacitors C1, C2 of memory cell MC are polarized in respectively opposite directions, to maintain the polarized condition. During reading, with word line WL raised, when plate line PL is first driven to H(High) level then returned to L(Low) level, a charge corresponding to the polarized condition of the pair of capacitors C1, C2 flows to bit lines BL, /BL, generating a minute voltage difference between the bit line pair. This voltage difference is detected by sensing amplifier SA.

FIG. 2 is a characteristic graph showing the relationship between the bit line capacitance and the voltage difference of a ferroelectric memory. The bit line capacitance CBL is shown along the horizontal axis and the voltage difference dVBL between the bit lines on reading is shown along the vertical axis. This characteristic shows that the bit line capacitance CBL has an optimum value Cx at which the voltage difference dVBL between the bit lines on reading is a maximum. In general, when the bit line capacitance becomes large, the change of voltage of the bit lines produced by the minute charge output from the memory cell on reading becomes small and the voltage difference dVBL between the bit lines becomes small. When the voltage difference between the bit lines becomes small, the detection margin of the sensing amplifier becomes small with the result that, in the worst case, reading may become impossible. Also, when the bit line capacitance becomes small, contrariwise, the voltage difference between the bit lines becomes larger, increasing the detection margin of the sensing amplifier.

A characteristic feature in FIG. 2 is, however, that, when the bit line capacitance CBL becomes smaller than the optimum value Cx, contrariwise, the voltage difference between the bit lines becomes smaller and the detection margin becomes smaller. The reasons for this are as follows. As described above, when reading, plate line PL is driven to H level from L level and the voltage of the bit line is raised by outputting to the bit line side a charge in accordance with the residual polarization condition of the cell capacitor at this point. Since the amounts of charge that are output to the bit lines differ in accordance with the residual polarization condition of the cell capacitors, a voltage difference is generated across the bit line pair. If therefore the bit line capacitance is too large, the change of bit line voltage produced by the charge flowing out from the cell capacitor becomes small.

However, if the bit line capacitance becomes very small, when the plate line PL is driven to H level, the voltage applied to the cell capacitor becomes small. The reason for this is that the voltage that is applied to the plate line PL (usually, power source voltage of 5V) is divided between the cell capacitor and the bit line capacitance, the divided voltage being applied to the cell capacitor. If the voltage that is applied to this cell capacitor is above the maximum voltage in the hysteresis characteristic of the ferroelectric material, the amount of charge flowing out from the cell capacitor becomes a maximum value. However, if the bit line capacitance becomes extremely small (or the cell capacitor capacitance becomes extremely large), causing the voltage applied to the cell capacitor to become less than the maximum voltage in the hysteresis characteristic of the ferroelectric material, the charge amount flowing out from the cell capacitor becomes smaller and contrariwise the voltage change of the bit line becomes smaller. As a result, a characteristic as shown in FIG. 2 is obtained.

Thus, when the bit line capacitance becomes smaller than optimum value Cx, the read margin decreases, which is undesirable. The bit line capacitance may become less than the optimum value Cx if, for reasons of the structure of the cell array, a construction is adopted in which the number of word lines is small so that the length of the bit lines in short. This tends to adversely affect the read margin, which is undesirable.

A special test for ferroelectric memory is a retention test, in which a check is made as to whether or not normal operation is retained in a condition in which the residual polarization of the ferroelectric capacitors is attenuated by putting the memory in a prescribed high-temperature condition. This test is time-consuming, since the memory must be held in a high temperature condition for a long time. Consequently, if there are a plurality of types of memory of different bit line capacitance, even if the characteristic variation is the same in the high temperature condition of the ferroelectric capacitors of the memories; the read margin will be different due to the difference of the bit line capacitances, so it will be necessary to perform a retention test in respect of all of the types of memory. If the bit line capacitance is the same for all types of memory, the read margin that is caused thereby will be the same, so a common retention test can be performed.

SUMMARY OF THE INVENTION

An object of the present invention is therefore to provide a ferroelectric memory wherein bit line capacitance can be optimized.

In order to achieve this object, according to one aspect of the present invention, in a ferroelectric memory, there are provided a plurality of word lines, a plurality of bit lines crossing there-with, a plurality of memory cells having ferroelectric capacitors arranged at the positions of these crossovers and a plurality of correction capacitors connectable with the bit lines. At least some of the plurality of correction capacitors are connected with a bit line so as to be capable of increasing bit line capacitance by a prescribed amount.

In an even more preferred embodiment, the correction capacitors are arranged in a twist region where the bit lines cross over. Or in another preferred embodiment, dummy capacitors of a dummy cell region formed at the periphery of a cell array having a plurality of memory cells are connected with the bit lines as correction capacitors. These correction capacitors are then suitably connected with the bit lines so as to make the bit line capacitances approach the optimum values. The number of correction capacitors connected is suitably selected. Also, this connection may be effected for example by the presence/absence of contact holes or the presence/absence of metal formation by the master slice method.

In another preferred embodiment, the correction capacitors are connected with the bit lines by switching means whose conduction is suitably controlled by means of a correction control signal. This correction control signal may for example be generated by setting in a register on power-on.

BRIEF DESCRIPTION OF THE DRAWINGS

FIG. 4 is a view given to define the polarization direction of a ferroelectric capacitor in the present specification;

DESCRIPTION OF THE PREFERRED EMBODIMENTS

An embodiment of the present invention is described below with reference to the drawings. However, the scope of protection of the present invention is not restricted to the following embodiment but extends to the invention as set out in the patent claims and to equivalents thereof.

Figure 1:
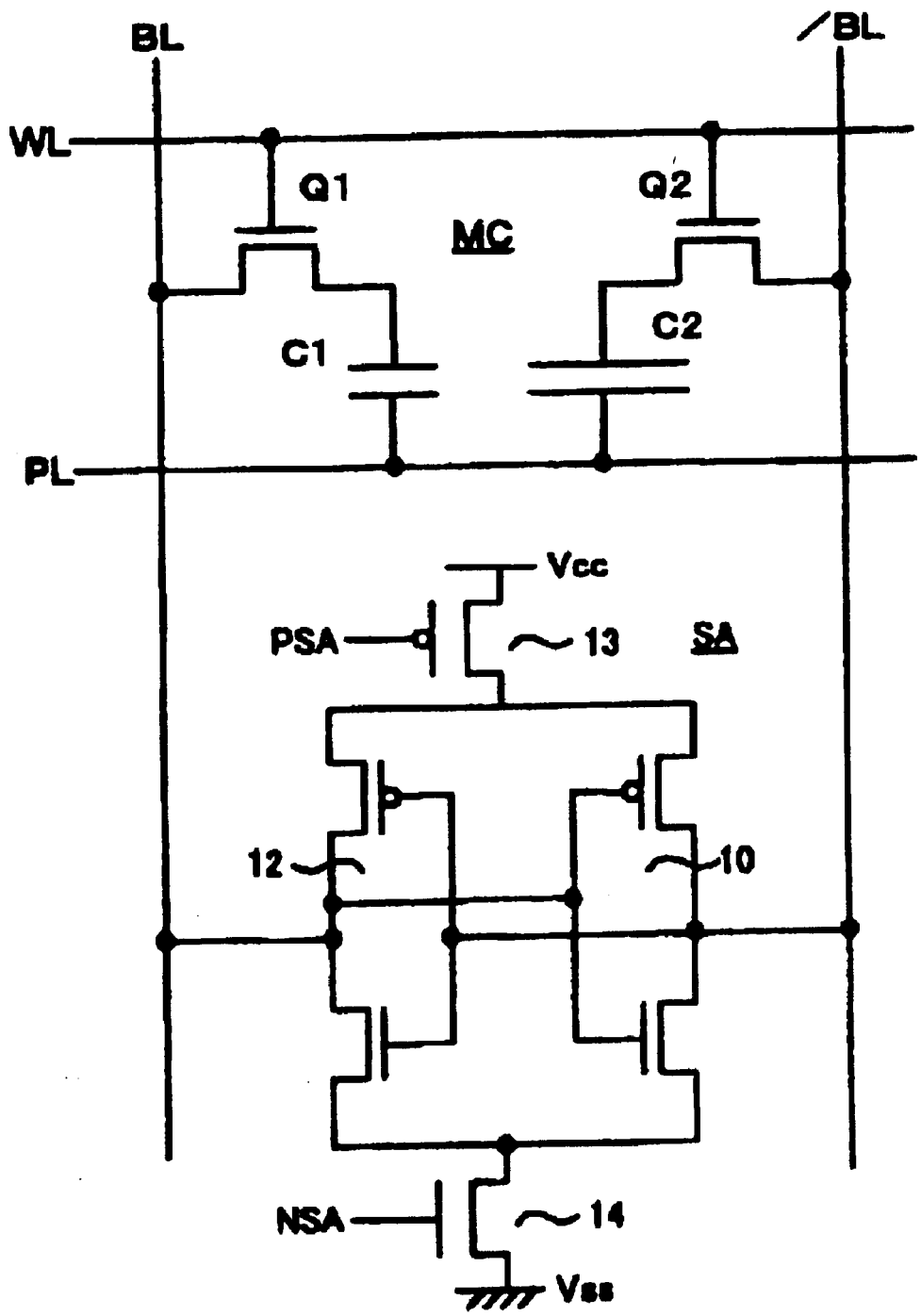
FIG. 1 is a circuit diagram of a typical prior art ferroelectric memory cell.
Figure 2:
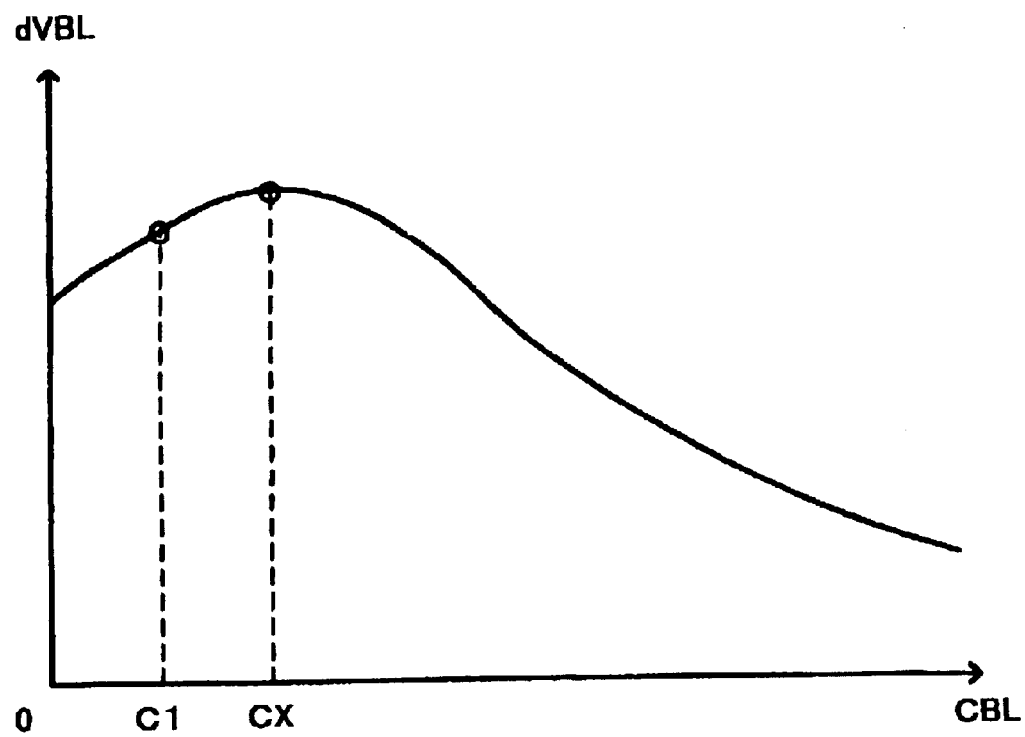
FIG. 2 is a characteristic illustrating the relationship between bit line capacitance and voltage difference of a ferroelectric memory cell.
Figure 3:
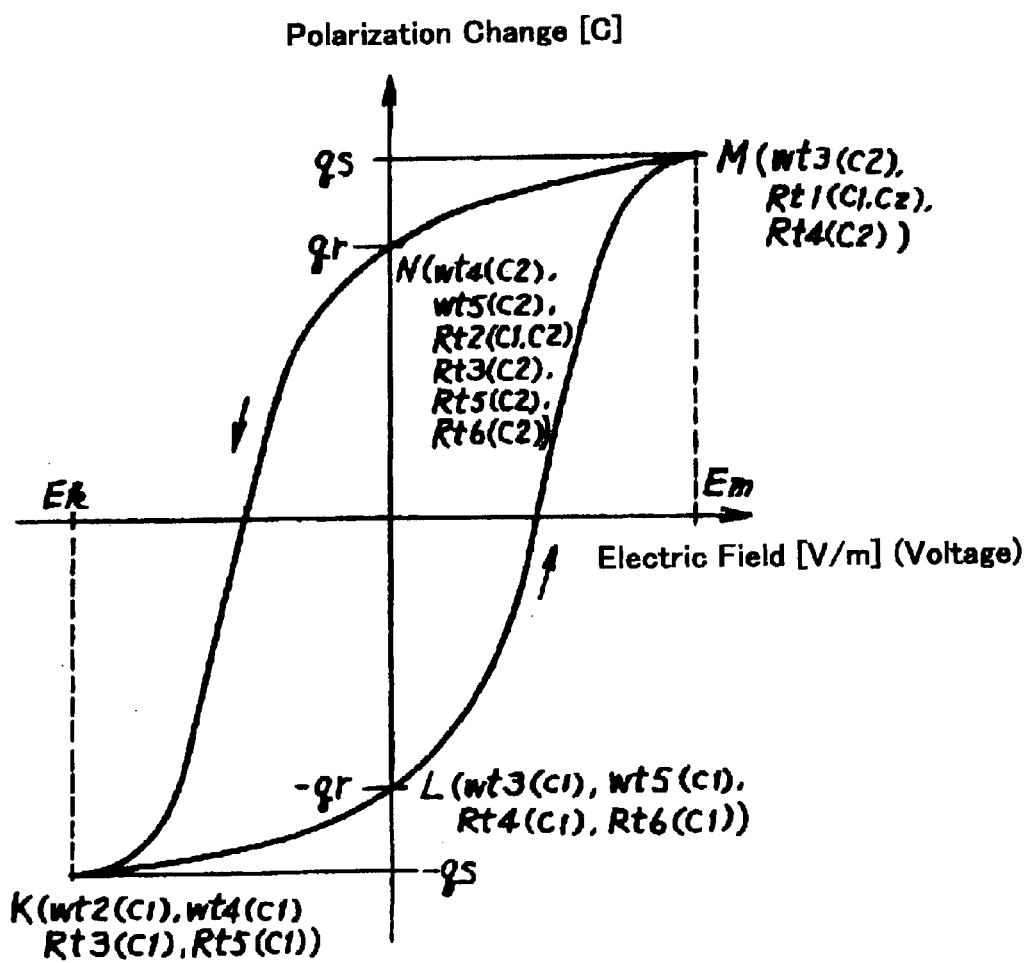
FIG. 3 is a view illustrating the hysteresis curve of a ferroelectric film.

First of all, the principles of operation of the ferroelectric memory cell illustrated in FIG. 1 will be briefly described. FIG. 3 is a view illustrating the hysteresis curve of a ferroelectric film. The applied electrical field or voltage is indicated along the horizontal axis and the polarization charge is indicated on the vertical axis. From this hysteresis curve, it can be Been that the state of polarization of the ferroelectric film changes from the point K on the hysteresis curve along the path: point L, point M, point N and point K.

FIG. 4 is a view given to define the polarization direction of a ferroelectric capacitor in the present specification. In FIG. 4, the respective conditions at the polarization conditions K, L, M and N shown in FIG. 3 are indicated. The hysteresis characteristic of the ferroelectric film will be described with reference to FIG. 3 and FIG. 4.

As shown in FIG. 4, when for example a downwardly directed electrical field Ek is applied by applying a voltage of 5V to ferroelectric capacitors C1, C2, a polarization charge –qs in the downwards direction in the Figure is generated on capacitors C1 and C2. On shifting from this condition K to a condition L in which the applied voltage between the capacitors is removed, polarization charge –qr remains on capacitors C1 and C2.

On the other hand, if 5V is applied in the upwards direction in the drawing to ferroelectric capacitors C1 and C2, an electrical field Em is applied in the upwards direction, producing a polarization condition M of polarization charge +qs. Even if from this condition M the voltage applied to the capacitors is removed, a polarization condition of polarization charge +qr is maintained on the capacitors as in condition N.

In this specification, the case of condition K or condition M in which electric field or voltage is applied between the capacitors is indicated by the arrows with solid lines and the case of condition L or N of residual polarization in a condition in which there is no potential difference between the capacitors and no electrical field is applied is indicated by the arrows with broken lines. The respective directions of polarization are indicated by the directions of the arrows.

Figure 5:
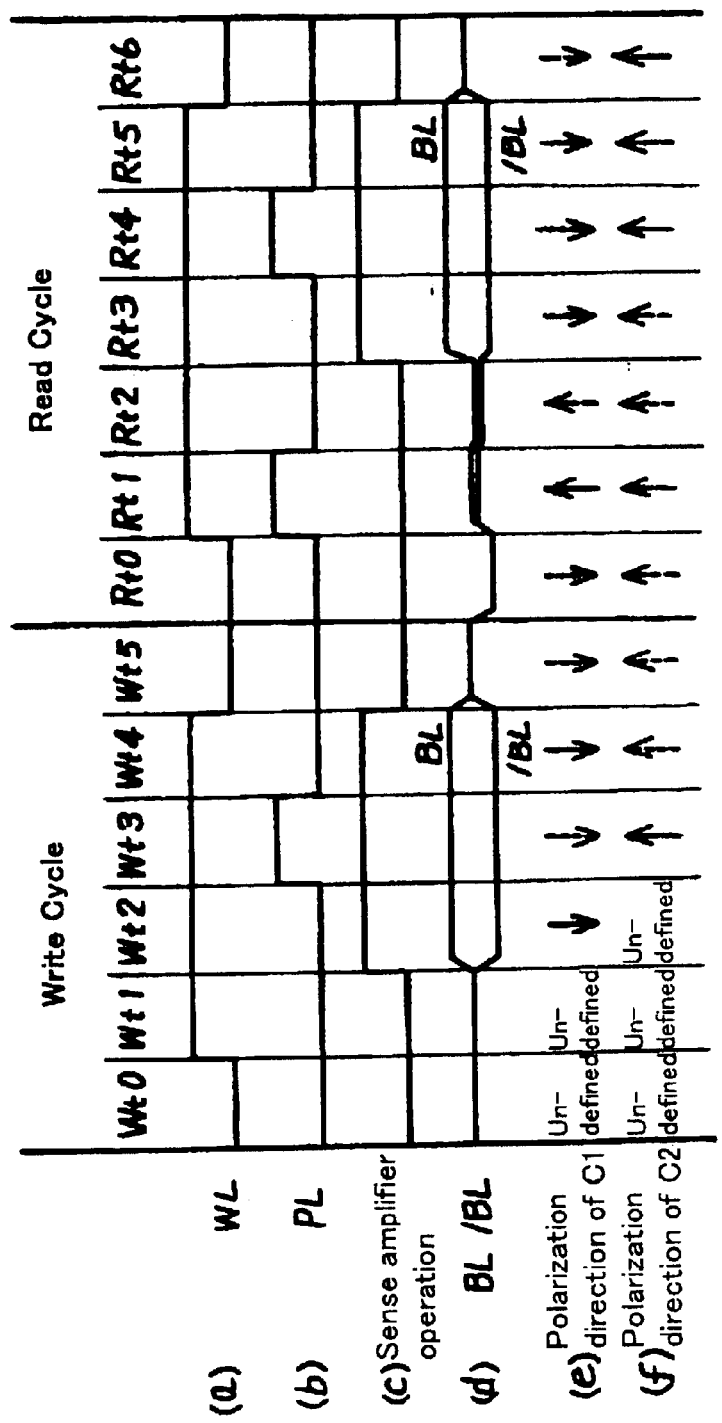
FIG. 5 is a timing chart of data writing and reading in a memory cell of 2T2C construction.

FIG. 5 is a timing chart of data writing and reading in a memory cell of 2T2C construction. This timing chart shows word line WL, plate line PL, sensing amplifier operation, bit line pair BL, /BL, and the polarization direction of capacitors C1 and C2. Time is shown along the direction of the horizontal axis in FIG. 5.

In the first write cycle, at time-point Wt0, the data that is written to the ferroelectric memory cell is undefined. Also, the bit line pair BL, /BL is reset to the intermediate potential and word line WL and plate line PL are L level. Next, at time point Wt1, when word line WL is driven to H level, the transistors Q1, Q2 of the memory cell MC conduct, causing the pair of capacitors C1, C2 to be connected to the respective bit line pair BL, /BL. Then at time point Wt2 sensing amplifier SA is actuated in accordance with the write data, causing the bit line BL to be driven to H level and bit line /BL to be driven to L level, respectively. As a result, ferroelectric capacitor C1 on the side of bit line BL has a downwardly directed electric field applied to it, and assumes the downwardly directed polarization condition of condition K. At this point, no electrical field is applied to ferroelectric capacitor C2 on the side of the other bit line /BL, so the direction of polarization stays undefined.

Next, at time point Wt3, when H level is applied to plate line PL, capacitor C2 which is connected with bit line /BL which is at L level is polarized in the opposite direction to C1. Specifically, capacitor C2 assumes condition M and capacitor C1 assumes condition L. Next, after plate line PL returns to L level and capacitor C1 is again polarized, at time point Wt5, word line WL returns to L level and cell transistors Q1, Q2 are turned OFF. As a result, capacitor C1 assumes the downwardly directed residual polarization condition L, and capacitor C2 assumes the upwardly directed residual polarization condition N. These residual polarization conditions are maintained even though the power source is turned OFF.

Next, in reading operation, bit line pair BL, /BL is Precharged to 0V at time-point Rt0. Then, when, at time point Rt1, word line WL is driven to H level and plate line PL is driven to H level, capacitor C1 shifts from condition L to condition M i.e. its polarization is inverted. Meanwhile, capacitor C2 shifts from condition N to condition M. As a result, ferroelectric capacitor C1 whose polarization has been inverted discharges more charge to the bit line than ferroelectric capacitor C2 whose polarization has not been inverted so that a prescribed potential difference is thereby generated across bit line pair BL, /BL.

Next, at time-point Rt2, plate line PL is made L level. As a result, the potential of the bit line pair drops somewhat but the potential difference referred to above is maintained. At time-point Rt3, the sense amplifier SA is activated and the potential difference across the bit line pair is thereby detected and amplified. As a result, the data stored in the ferroelectric capacitor is read through the bit line.

At the time point Rt1, both capacitors C1 and C2 are put in the upwardly polarized condition (condition M), so the stored data is destroyed. Accordingly, at time points Rt4 and Rt5, data rewriting is performed by supplying to ferroelectric capacitors C1 and C2 the results of the amplification by the sensing amplifier, by driving plate lines PL to H level and L level, respectively. Then, when word line WL becomes L level at time-point Rt6, the residual polarization condition in accordance with the stored data is maintained in the capacitors of the memory cell.

As will be clear from the above description, on reading, the plate line PL is driven from L level to H level, thereby causing the charge of the ferroelectric capacitors to be output onto the bit line pair, generating a minute voltage difference on the bit line pair. A difference in voltages of the bit lines of one pair is generated in accordance with the difference of charges from the ferroelectric capacitors. That is, as the capacitance of the bit lines becomes smaller, the change in voltage produced by the charge of the ferroelectric capacitors becomes larger and the voltage difference also becomes larger.

However, if the bit line capacitance becomes smaller than the optimum value Cx, the ratio of the capacitances of the ferroelectric capacitors becomes small so that, at the time when, on reading, the plate line PL is driven to H level, the voltage applied to the ferroelectric capacitors becomes small. If this applied voltage becomes smaller than the applied voltage (maximum voltage) of condition M of FIG. 3, the amount of charge flowing out due to the residual polarization becomes smaller than the maximum value. As a result, the voltage difference across the bit line pair becomes small.

Accordingly, in this embodiment, if the bit line capacitance has become smaller than the optimum value Cx, this capacitance can be increased so that it is corrected to the optimum value Cx. For this purpose, correction capacitors for correcting the capacity of the bit lines are provided beforehand in the cell array, these correction capacitors being made capable of connection to the bit lines in accordance with the final characteristic.

Figure 6:
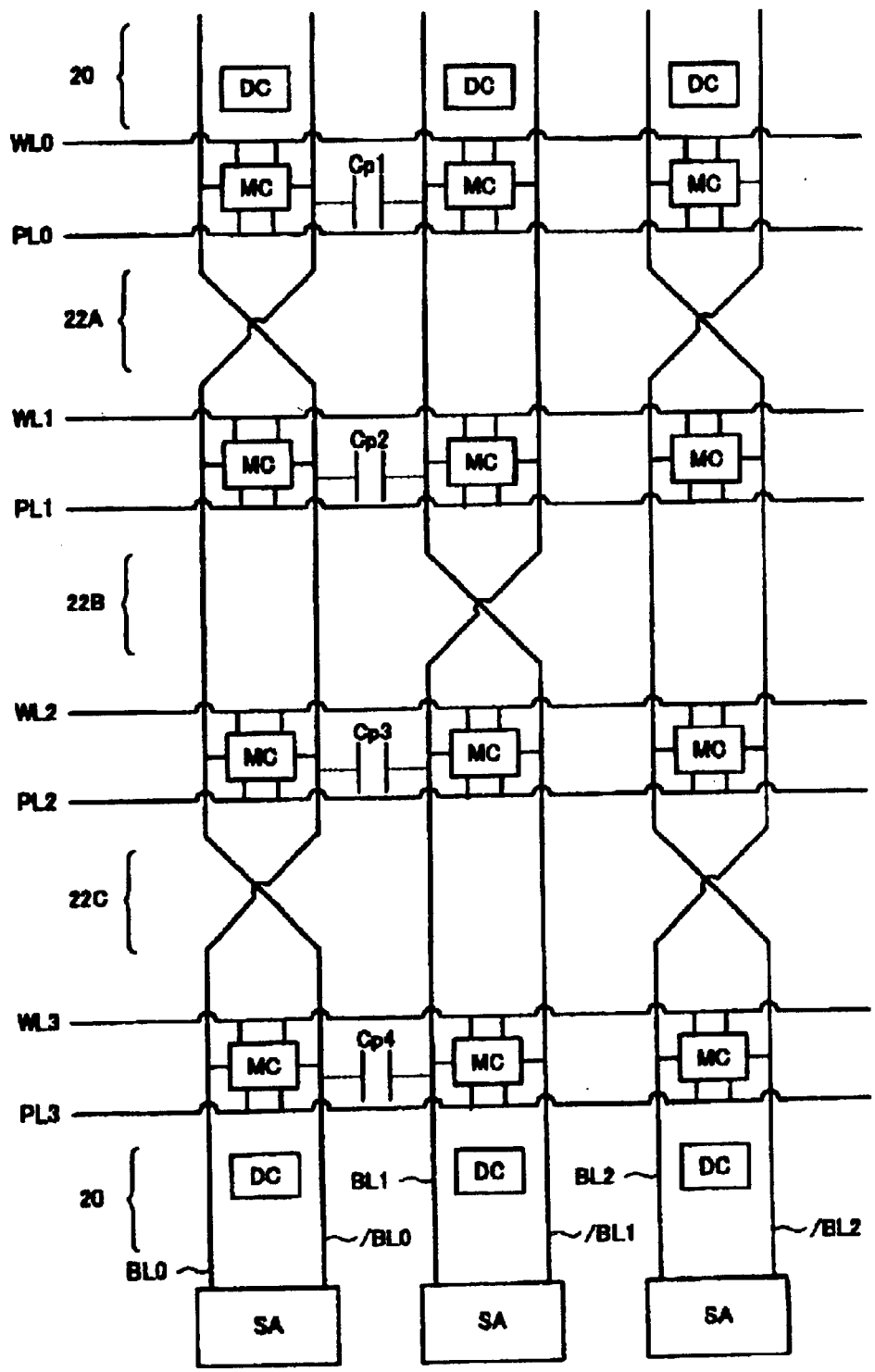
FIG. 6 is a view illustrating the cell array construction of a memory.

FIG. 6 is a view illustrating the cell array construction of a memory. Memory cells MC as shown in FIG. 1 are arranged in matrix fashion. In the row direction, a plurality of word lines WL0 to 3 and plate lines PL0 to 3 are arranged; in the column direction, a plurality of bit line pairs BL0 to 2, /BL0 to 2 are arranged; each memory cell is connected to the respective word line, plate line and bit line pair. A sense amplifier SA is connected to each bit line pair.

In order to reduce the effects of manufacturing process on the cell array, dummy cell regions 20 in which dummy cells DC are formed are provided at the periphery of the cell array. Dummy cells DC are of the same construction as real memory cells MC, but the dummy cell transistors are not connected to bit line pairs and the dummy cell transistors and dummy capacitors are not connected. By arranging dummy cells DC at the periphery of the cell array, adverse effects on the manufacturing process due to the loss of regularity of the construction of the peripheral region of the cell array can be alleviated.

Furthermore, within the cell array, twist regions 22A, B, C are provided where the positions of the pair of bit lines are inverted in order to reduce crosstalk between bit line pairs. Bit line pair BL0, /BL0 cross over in twist regions 22A, 22C; bit line pair BL1, /BL1 cross over in twist region 22B and bit line pair BL2, /BL2 cross over in twist regions 22A, 22C. By such a construction, crosstalk supplied through stray capacitances Cp1 to Cp4 between the bit lines can be neutralized.

For example, referring to bit line BL0, by adopting a twist construction, bit line BL0 receives the effect of changes in voltage of rightwardly adjacent bit line pair BL1, /BL1 through stray capacitance Cp3 from bit line BL1 and through stray capacitance Cp2 from bit line /BL1. Since bit line pair BL1, /BL1 are driven in reverse-phase during reading and writing, crosstalk can be neutralized by the effects from both sides of the bit line pair. Likewise, referring to bit line /BL0, this receives the effect from bit line pair BL1 through stray capacitance Cp4 and from bit line /BL1 through stray capacitance Cp1. The effect of crosstalk can therefore be neutralized in this case also.

Thus, in order to reduce the effects of crosstalk from adjacent bit line pairs, even numbered bit line pairs BL0, /BL0, BL2, /BL2 cross over on the left and right in twist regions 22A, 22C, while odd-numbered bit line pair BL1, /BL1 cross over on the left and right in twist region 22B.

As described above, in the cell array construction of the ferroelectric memory, in the peripheral region thereof, a dummy cell region 20 is provided whereas, within the cell array twist, regions 22 are provided in several locations. In a preferred embodiment, correction capacitors are formed in this dummy regions 20 and twist regions 22, being suitably connected to bit line pairs. As will be described, dummy cells are already formed in the dummy regions 20, so the dummy capacitors in these dummy cells can be utilized as correction capacitors. Also, space for crossing over of the bit lines is guaranteed within the twist regions 22, so correction capacitors can be provided in these regions 22. In this way, it is unnecessary to add a fresh region for the provision of the correction capacitors in the cell array.

Figure 7:
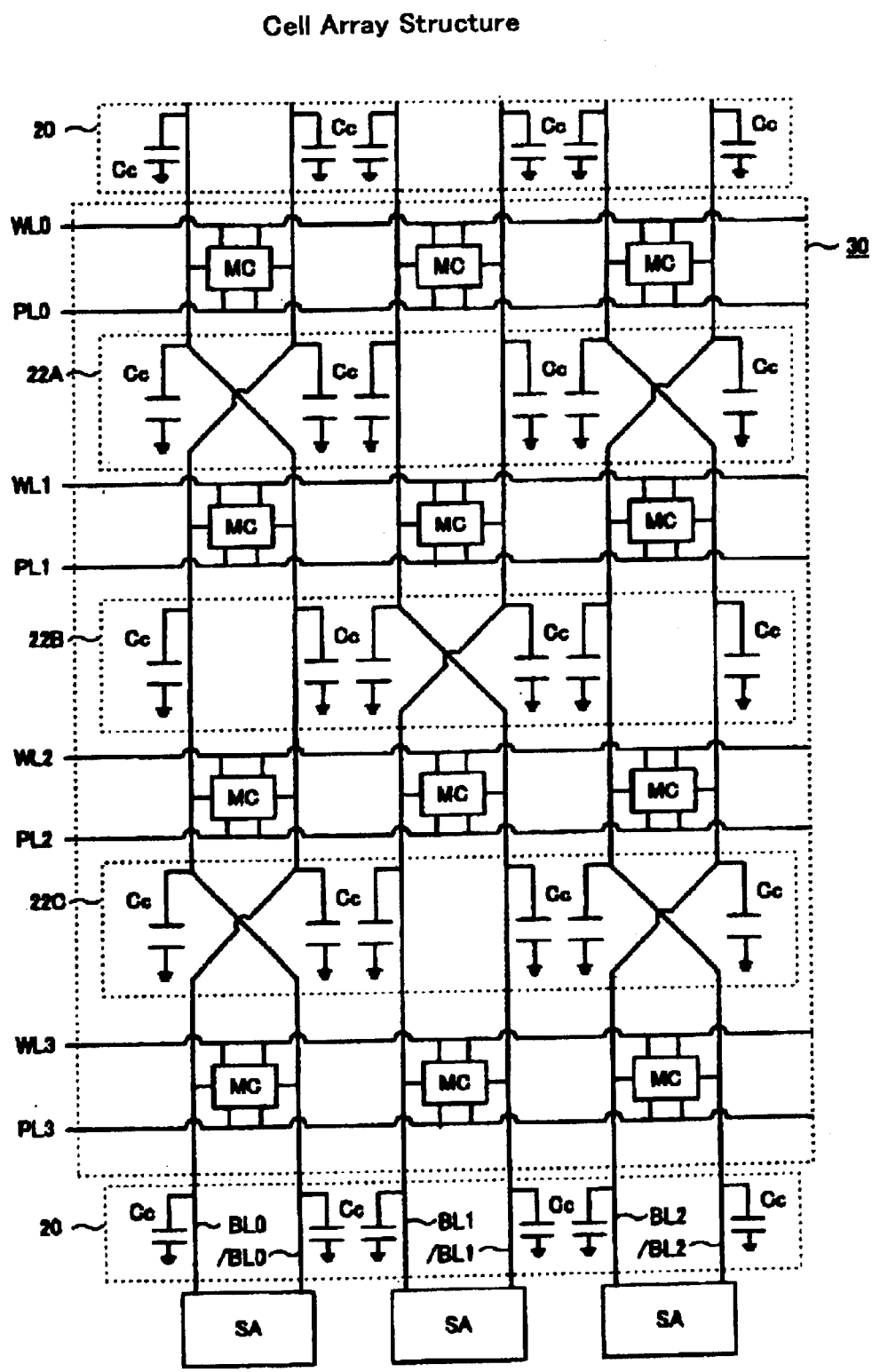
FIG. 7 is a view of a cell array construction in the present embodiment.

FIG. 7 is a view of a cell array construction in the present embodiment. Correction capacitors Cc are provided beforehand in the twist regions 22A, 22B, and 22C in the cell array 30, these correction capacitors Cc being connected with corresponding bit line pairs BL, /BL. In addition, capacitors formed for the dummy cells are connected to the corresponding bit line pair as correction capacitors Cc in the peripheral dummy cell regions 20 of the cell array 30. Consequently, in the example of FIG. 7, correction is effected such as to increase the capacitance of the bit line by connecting five correction capacitors Cc to a single bit line.

Figure 8:
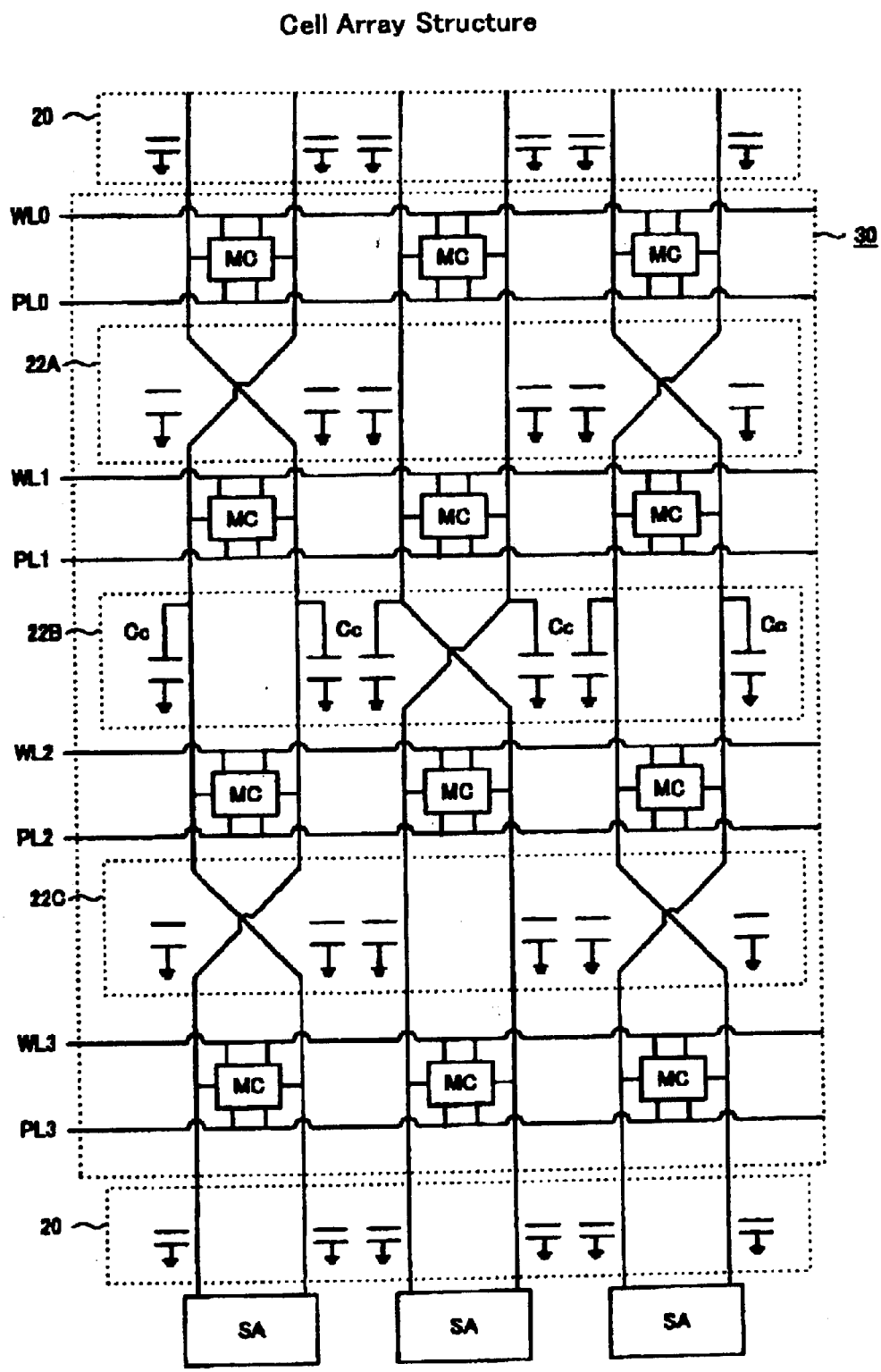
FIG. 8 is a view of a cell array construction in the present embodiment.

FIG. 8 is a cell array layout diagram in this embodiment. In this example also, correction capacitors Cc are provided beforehand in twist regions 22A, 22B, and 22C within the cell array and in the peripheral dummy cell regions 20. However, in example of FIG. 8, only the correction capacitors Cc that are provided in the twist region 22B are connected with the bit line pairs. A single correction capacitor Cc is therefore connected with each bit line, correction thereby being effected such that the capacitance thereof is increased.

The number of correction capacitors connected with a bit line can be altered in each manufacturing process lot or for each product. For this purpose, connection of the correction capacitor and bit line can be performed for example by a metal option of whether or not a contact hole is formed. Furthermore, as will be described, fine adjustments to the bit line capacitance can be achieved by providing connection transistors between the correction capacitor and bit line and controlling conduction/non-conduction of the connection transistors by means of a control signal.

Figure 9:
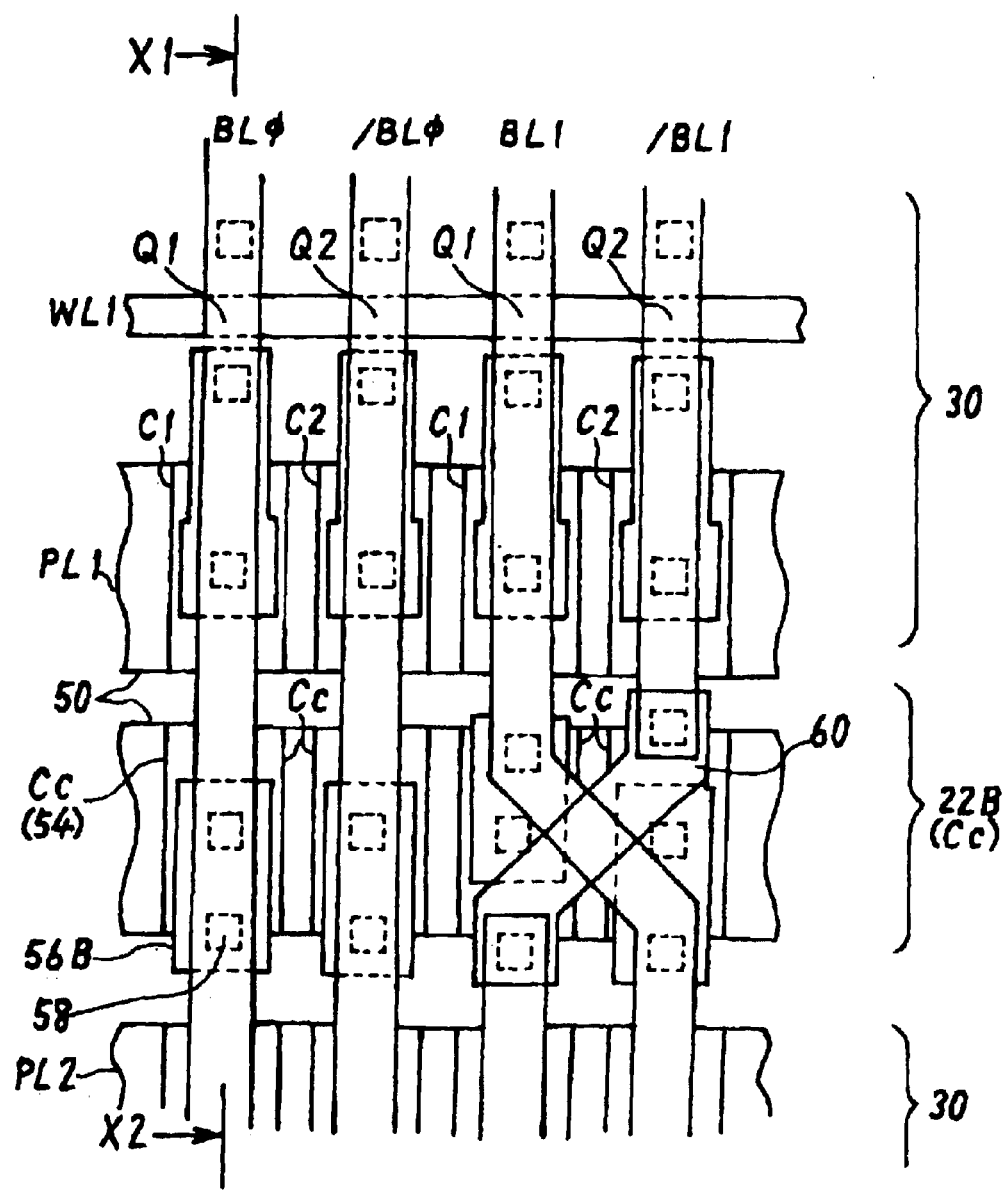
FIG. 9 is a partial plan view of the cell arrays of FIGS. 7 and 8.
Figure 10:
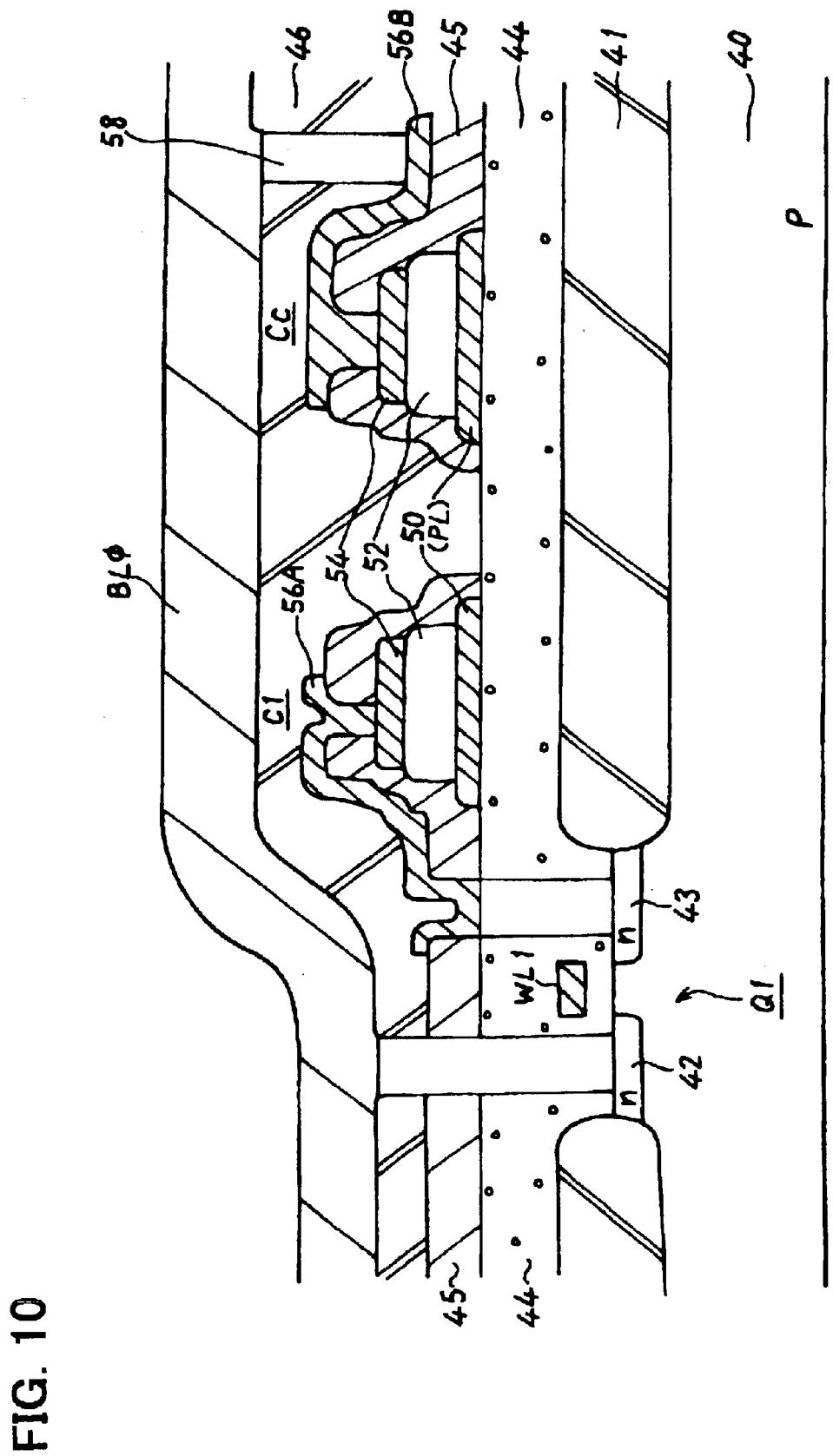
FIG. 10 is a cross-sectional view of the cell arrays of FIGS. 7 and 8.

FIG. 9 is a partial plan view of the cell arrays, of FIG. 7 and 8. FIG. 10 is a cross-sectional view thereof. The plan view of FIG. 9 shows a word line WL1, plate line PL1, bit line pairs BL0, /BL0, BL1, /BL1 and the twist region 22B. Also, FIG. 10 shows a cross-sectional view along bit line BL0 shown at X1–X2 of FIG. 9. On the surface of a P type semiconductor substrate 40, there are provided a field oxide film 41 and N type source and drain regions 42 and 43. Word line WL1 is a gate electrode formed of for example polycrystalline silicon. Bit line BL0 is formed in the direction crossing word line WL. That is, memory cell transistor Q1 is constituted by word line WL1 and source and drain regions 42 and 43.

Memory cell capacitor C1 and correction capacitors Cc are formed at a position leveled by means of insulating film 44 formed on field oxide film 41. As shown in the Figure, the two capacitors C1 and Cc are constituted by an underside electrode 50 extending in the horizontal direction and ferroelectric material layer 52 and upper electrode 54 formed in respectively isolated fashion thereupon, being covered by insulating film 45. Underside electrode 50 corresponds to plate line PL and extends in the direction perpendicular to the plane of FIG. 10 or in the horizontal direction of FIG. 9. Ferroelectric material layers 52 and the upper electrodes 54 are isolated for each capacitor.

The source/drain region 43 of the cell transistor is connected with upper electrode 52 of cell capacitor C1 by means of conductive layer 56A. Also, a further source/drain region 42 is connected with bit line BL0, constituted by a conductive layer. Furthermore, bit line BL0 is connected with conductive layer 56B by means of a contact hole 58. This conductive layer 56B is formed in extending fashion, being connected with upper electrode 54 of correction capacitors Cc. Underside electrode 50 of the correction capacitor also extends in the direction perpendicular to FIG. 10 i.e. the horizontal direction of FIG. 9 and has ferroelectric material layer 52 and upper electrode 54 provided in respectively isolated fashion thereupon. This underside electrode 50 is connected with ground potential.

A correction capacitor Cc is therefore connected with the corresponding bit line if a contact hole 58 is formed in the insulating layer 46 but is not connected therewith if no contact hole 58 is formed. Whether or not a correction capacitors Cc is connected with a bit line can therefore be controlled by the option of forming or not forming such contact holes 58. In another example, the correction capacitor is not connected with the bit line if no extending conductive layer 56B is formed but is connected therewith if such a layer 56B is formed. Thus connection of the correction capacitors to the bit lines can also be controlled depending on the formation or non-formation of such a conductive layer 56B.

As shown in FIG. 9, bit line pair BL1, /BL1 crosses over in twist region 22B. Bit line /BL1 is therefore connected with a conductive layer 60 constituting a layer further above the conductive layer of the bit line, through the contact hole. Thus, in order for the bit line pair to cross over, a twist region 22B of prescribed length in the vertical direction of FIG. 9 is necessary. In this embodiment, correction capacitors Cc are formed beforehand using this twist region 22B.

Figure 11:
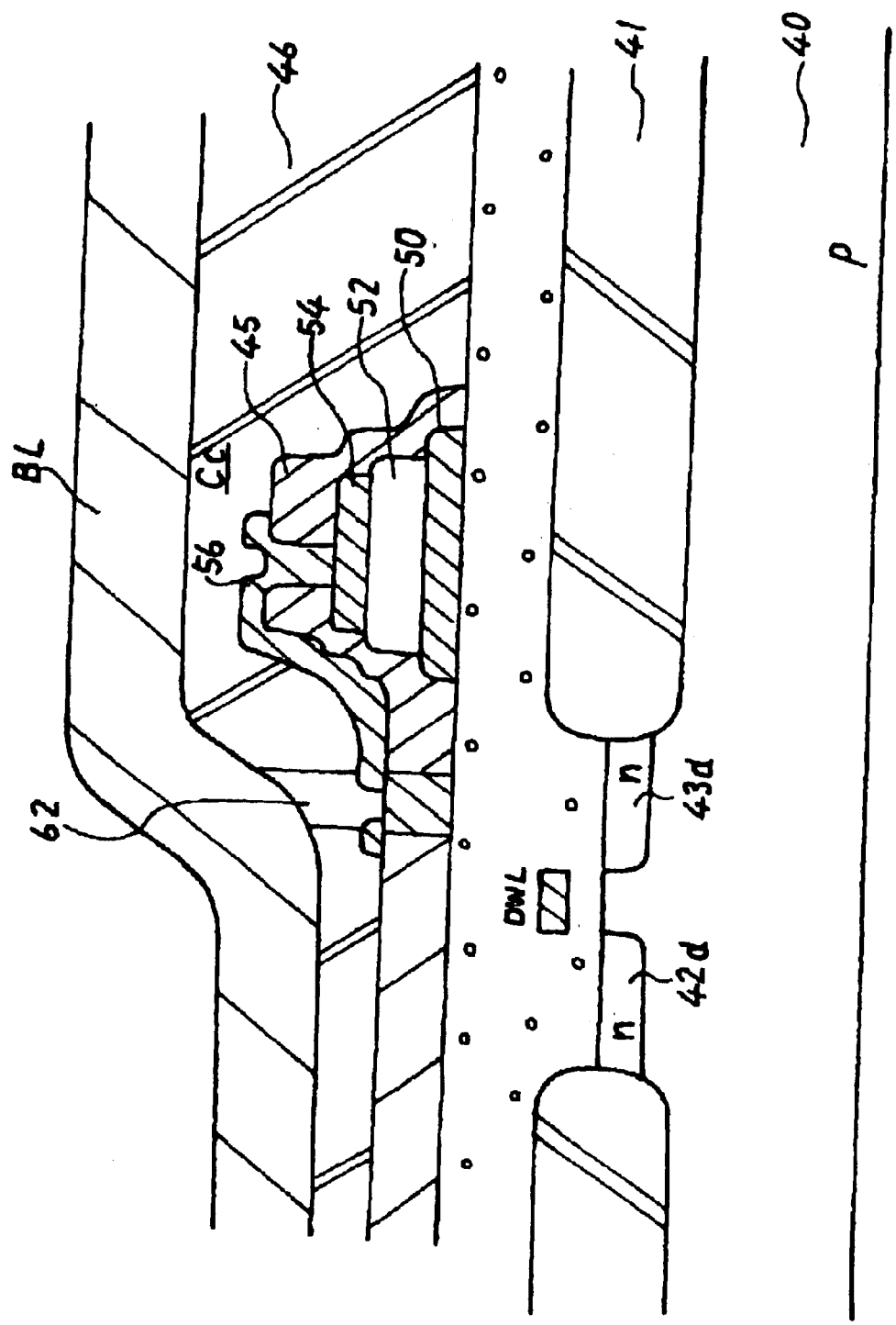
FIG. 11 is a cross sectional view of a dummy region of FIGS. 7 and 8.

FIG. 11 is a cross-sectional view of a dummy region. In the dummy region, structures which are the same as that of the memory cells in the cell array region are formed. The reference numerals of the various regions or layers are therefore the same as in the case of FIG. 10. Also, the plan view thereof is the same as that of the cell array region 30 of FIG. 9.

As shown in FIG. 11, source/drain region 42d constituting the transistor of a dummy cells is not connected with bit line BL. Also, a further source/drain region 43d is not connected with the capacitor. Instead, bit line BL and conductive layer 56 connected with upper electrode 54 of the capacitor of the dummy cell are connected through contact hole 62. It is therefore possible to control whether or not correction capacitor Cc is connected with bit line BL by whether or not such a contact hole 62 is formed. As a further example, such control could be effected by whether or not conductive layer 56 is formed.

Figure 12:
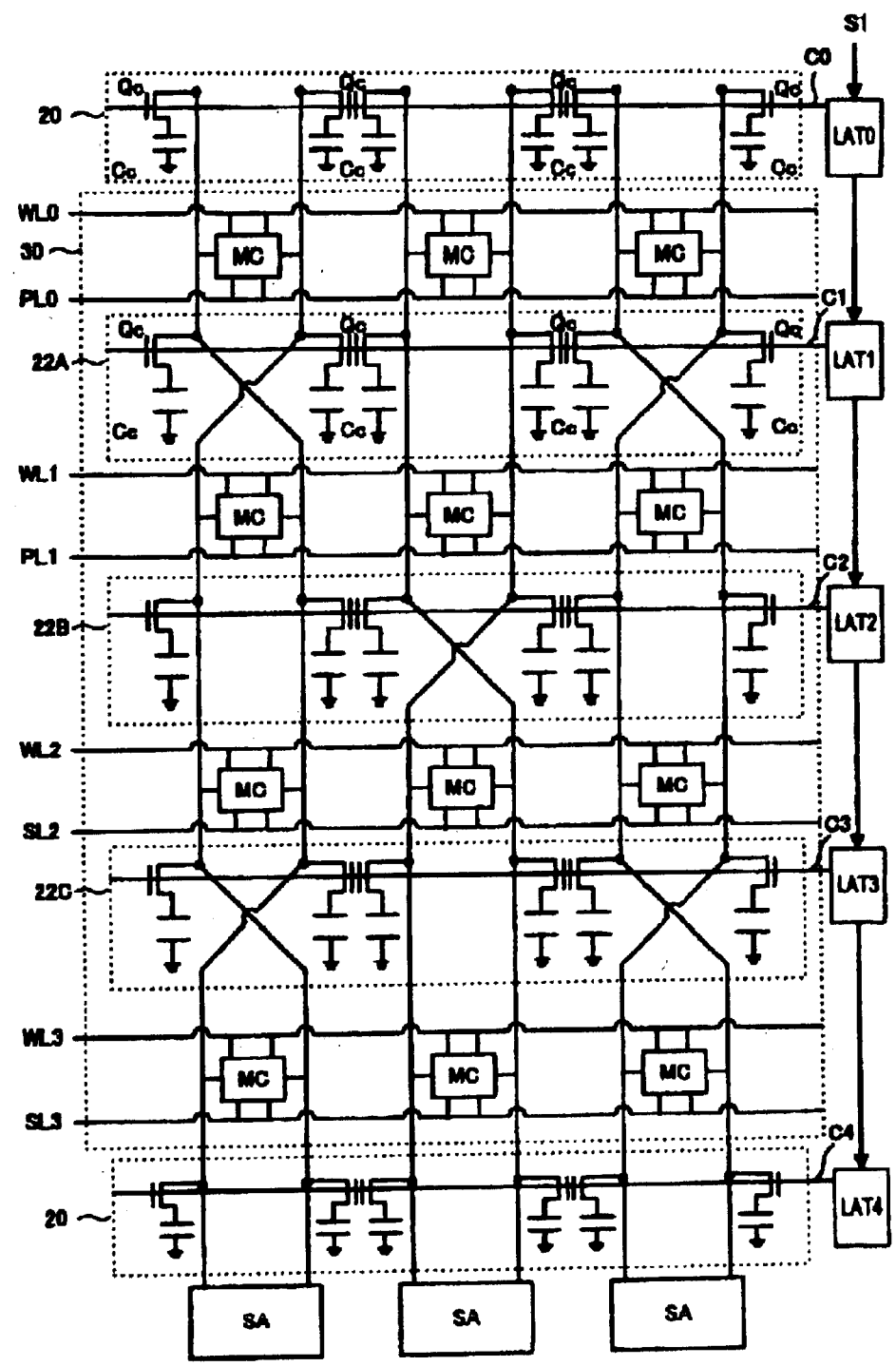
FIG. 12 is an array layout diagram of a second embodiment.

FIG. 12 is an array layout diagram of a second embodiment. In this second embodiment also, in order to make it possible to increase or regulate capacitance in respect of the bit lines, correction capacitors Cc are provided in twist regions 22 and dummy cell regions 20. Furthermore, in this second embodiment, instead of connecting the correction capacitor to the bit line by presence/absence of a contact hole, the correction capacitor Cc is connected with the bit line by means of a correction transistor Qc constituting a switching element. A correction transistor QC is therefore provided between the correction capacitors Cc and the bit lines and conduction/non-conduction of this transistor is controlled by means of correction control signals C0–C4. These correction control signals C0–C4 are generated by means of latch circuits LAT0–LAT4 that latch correction control data S1.

For example, on power-on, conduction of correction transistor Qc is controlled by sequentially latching correction control data S1 in latch circuit LAT0–LAT3 for such capacity correction. Consequently, even after assembling the memory in the package, the number of correction capacitors added to the bit lines can be freely controlled the control data to the latch circuits via setting the control data to the latch circuits via supplying correction control data S1 from outside.

In FIG. 12, if only latch circuit LAT0 latches correction control data "1" and the remainder of the latch circuits LAT1–LAT4 latch correction control data "0", only correction control signal C0 is driven to H level and the remaining correction control signals C1–C4 stay at L level. As a result, only the correction capacitor Cc in one of the dummy regions 20 is connected to a the bit lines. Thus, the number of correction capacitors Cc connected with the bit lines can be controlled in accordance with the correction control data latched by the latch circuits.

In the second embodiment, the correction control transistors for connection control are required. However, since dummy transistors are formed in the dummy cell region, these transistors can be utilized, and the gate electrodes of the dummy transistors can bemused as the control signal lines. Also, correction transistors can be provided by forming transistors identical with the memory cells in the twist regions. That is, the second embodiment can be implemented by providing a memory cell structure also in the twist regions. The addition of correction transistors does not result in a large increase in area.

In the above embodiments, at least one correction capacitor of the plurality of correction capacitors provided for a bit line may have a different capacitance value from that of the other correction capacitors. For example, by making the capacitance values of the plurality of correction capacitors in binary unit ratios i.e. 1: 2: 4: 8, any desired capacitance value can be added to the bit line by suitably selecting these correction capacitors. These capacitance values may simply be designed such that the areas of the upper electrodes of the correction capacitors are in the above ratios and, in particular, there is then no need to alter or add memory manufacturing processes.

With the embodiments described above, correction capacitors connectable with the bit lines can be formed beforehand without needing to provide fresh regions. Also, the bit line capacitance can be made to be an optimum value by suitably increasing it by suitably connecting correction capacitors to the bit lines in accordance with the capacitance value of the bit lines.

Since, with the present invention as described above, in a ferroelectric memory, the bit line capacitances can be corrected to the optimum value by suitably increasing these, lowering of the read margin can be prevented.

What is claimed is:

1. A ferroelectric memory comprising:
a plurality of word lines;
a plurality of bit lines crossing said word lines;
a plurality of memory cells, arranged at crossovers of said word lines and bit lines, including a ferroelectric capacitor; and
a plurality of correction capacitors connectable with said bit lines,
wherein at least a part of said plurality of correction capacitors are connected with said bit lines.

2. The ferroelectric memory according to claim 1, wherein, in a cell array region where said plurality of memory cells are provided, a twist region where said bit lines cross over is provided; and
said correction capacitors are formed within said twist region.

3. The ferroelectric memory according to claim 1, wherein, in a peripheral region of a cell array region where said plurality of memory cells are provided, there is provided a dummy cell region where dummy cells are provided; and
said correction capacitors are formed in the dummy cell region.

4. The ferroelectric memory according to claim 1, wherein a plurality of said correction capacitors are provided for each bit line, and an optimized number of correction capacitors are connected with a corresponding bit line.

5. The ferroelectric memory according to claim 4, wherein capacitance values of at least a part of said plurality of correction capacitors are different from those of remaining correction capacitors, so that an amount of alteration of a capacitance value of the bit line is different depending on combination of correction capacitors connected thereto.

6. The ferroelectric memory according to claim 1, wherein connection of said correction capacitor and bit line is effected through a contact hole or conductive layer formed above a semiconductor substrate, and said connection or non-connection is controlled by whether or not such contact hole or conductive layer is formed.

7. The ferroelectric memory according to claim 1, wherein a switching element is further provided between said correction capacitor and bit line, and a control signal line that controls conduction or non-conduction of the switching element is provided.

8. The ferroelectric memory according to claim 7, comprising a control signal generating circuit that applies a control signal to said control signal line, and said control signal of said control generating circuit is set in accordance with control data.

9. The ferroelectric memory according to claim 1, wherein a pair of bit lines is connected with said memory cell;
a twist region where the pair of bit lines cross over is provided in a region of said plurality of memory cells; and
said correction capacitors are formed in said twist region.

10. A ferroelectric memory comprising:
a cell array region including a plurality of word lines, a plurality of bit lines crossing said word lines, and a plurality of memory cells which are arranged at crossovers of said word lines and bit lines and each include a ferroelectric capacitor and a transistor; and
a plurality of correction capacitors connectable with said bit lines, and provided within said cell array region and/or provided at a periphery of said cell array region;
wherein at least a part of said plurality of correction capacitors are connected with said bit lines.

11. The ferroelectric memory according to claim 10, wherein said correction capacitor is a ferroelectric capacitor having the same construction as a ferroelectric capacitor within said memory cell.

12. The ferroelectric memory according to claim 10, further comprising a semiconductor substrate;
wherein said bit line is formed by a conductive layer which is provided above said word line above said semiconductor substrate; and
said correction capacitor is formed below the conductive layer of said bit line together with a ferroelectric capacitor within said memory cell.

13. The ferroelectric memory according to claim 10, further comprising a semiconductor substrate;
wherein a ferroelectric capacitor of said memory cell and said correction capacitor are arranged together on an insulating layer formed above said semiconductor substrate.

* * * * *